(12) United States Patent
Barrenscheen (10) Patent No.: US 7,893,715 B2
(45) Date of Patent: Feb. 22, 2011

(54) ARRANGEMENT AND METHOD FOR SIGNAL TRANSMISSION BETWEEN DIFFERENT VOLTAGE DOMAINS

(75) Inventor: Jens Barrenscheen, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 12/419,762

(22) Filed: Apr. 7, 2009

(65) Prior Publication Data
US 2010/0254478 A1    Oct. 7, 2010

(51) Int. Cl.
*H03K 19/0175* (2006.01)
(52) U.S. Cl. .............................. 326/80; 326/62; 327/333
(58) Field of Classification Search ................... 326/63, 326/68, 80–83, 86; 327/108, 109, 333
See application file for complete search history.

(56) References Cited

U.S. PATENT DOCUMENTS 5,808,480 A * 9/1998 Morris ......................... 326/81
6,242,962 B1 * 6/2001 Nakamura .................... 327/333
2007/0008001 A1 * 1/2007 Sanchez et al. ................ 326/80

* cited by examiner

*Primary Examiner*—Rexford N Barnie
*Assistant Examiner*—Jany Tran
(74) *Attorney, Agent, or Firm*—Dicke, Billig & Czaja, PLLC (57) ABSTRACT

An arrangement and method for signal transmission between different voltage domains is disclosed. One embodiment provides a first signal processing unit receiving a first supply voltage. A second signal processing unit receives a second supply voltage, the first supply voltage and the second supply voltage overlap each other in a first overlap range. A third signal processing unit receives a third supply voltage, the second supply voltage and the third supply voltage overlap each other in a second voltage overlap range. A first information signal from the first signal processing unit is transmitted to the second signal processing unit. A second information signal dependent on the first information signal from the second signal processing is transmitted to the third signal processing unit.

19 Claims, 7 Drawing Sheets

ARRANGEMENT AND METHOD FOR SIGNAL TRANSMISSION BETWEEN DIFFERENT VOLTAGE DOMAINS

BACKGROUND

For signal transmission between signal processing units that receive supply voltages of different voltage domains level-shifters are required. Supply voltages of different voltage domains are voltages that are related to different reference potentials. Level-shifters transfer signals provided by one of the processing circuits and lying within one voltage domain to signals lying in the other voltage domain, thereby enabling the signal to be processed by the other signal processing unit. In cases where there is a large voltage difference between the reference potentials of the different voltage domains high-voltage components are required in the level shifter. However, high-voltage components are expensive and difficult to integrate in an integrated circuit together with the signal processing unit.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides a signal transmission method, including: providing a first signal processing unit that receives a first supply voltage; providing a second signal processing unit that receives a second supply voltage, the first supply voltage and the second supply voltage overlapping each other in a first overlapping range; providing a third signal processing unit that receives a third supply voltage, the second supply voltage and the third supply voltage overlapping each other in a second voltage overlapping range; transmitting a first information signal from the first signal processing unit to the second signal processing unit; and transmitting a second information signal that is dependent on the first information signal from the second signal processing to the third signal processing unit.

A further embodiment provides a signal transmission arrangement, including: a first signal processing unit adapted to receive a first supply voltage; a second signal processing unit adapted to receive a second supply voltage, the first supply voltage and the second supply voltage overlapping each other in a first overlap range; a third signal processing unit adapted to receive a third supply voltage, the second supply voltage and the third supply voltage overlapping each other in a second voltage overlap range. The first signal processing unit is adapted to transmit a first information signal from the first signal processing unit to the second signal processing unit, and the second signal processing is adapted to transmit a second information signal that is dependent on the first information signal from the second signal processing to the third signal processing unit.

Figure 1:
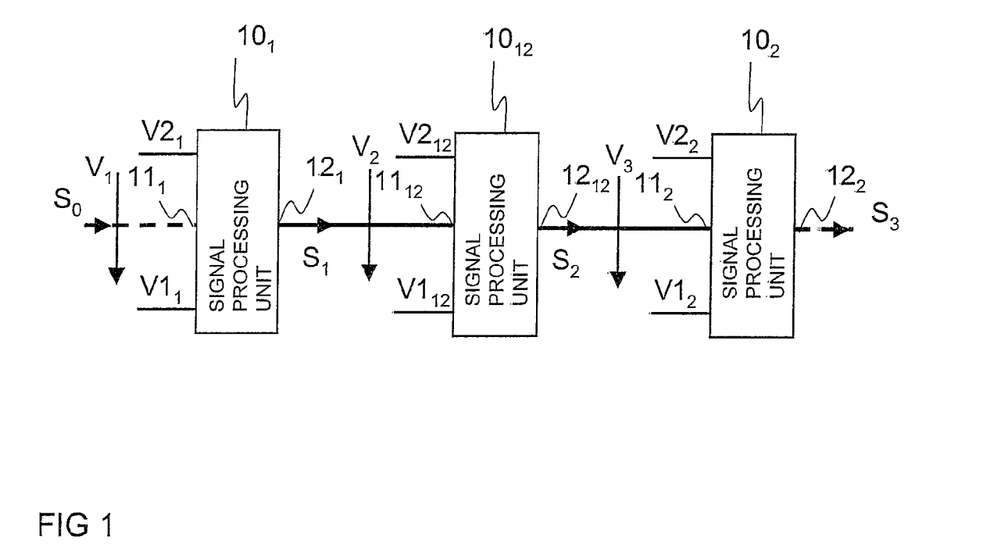
FIG. 1 illustrates one embodiment of a system, method and a circuit arrangement for signal transmission between signal processing units that receive supply voltages of different voltage domains.

FIG. 1 illustrates embodiments of a circuit arrangement that includes a first signal processing unit $10_1$ and a second signal processing $10_2$. These signal processing units $10_1, 10_2$ receive supply voltages $V_1, V_2$ of different voltage domains. In one embodiment a voltage domain is a voltage range that is defined by a reference voltage and an absolute value (amplitude). Voltages of one voltage domain are voltages that lie within the voltage range defined by the reference value and the absolute value.

These voltage domains assigned to the first and second signal processing units are, for example, defined by the supply voltages $V_1, V_2$. In the embodiment illustrated in FIG. 1, the first supply voltage $V_1$ is a voltage between a first upper supply potential $V2_1$ and a first lower supply potential $V1_1$. The voltage domain defined by the first supply voltage has one of the supply potentials $V1_1$, $V2_1$ as a reference potential and the absolute value of the first supply voltage $V1_1$ as an absolute value. If the first or the second supply potential $V1_1$, $V2_1$ is the reference potential, it is dependent on the direction (prefix) the voltages have that are within the voltage domain. Amplitudes of voltages of the first voltage domain may vary in a range between zero and the first supply voltage $V_1$, with $V_1 = V2_1 - V1_1$.

In the embodiment illustrated in FIG. 1, the second supply voltage $V_2$ is a voltage between a second upper supply potential $V2_2$ and a second lower supply potential $V1_2$. The voltage domain defined by the second supply voltage has one of the supply voltages $V1_2$, $V2_2$ as a reference potential and the absolute value of the second supply voltage $V_2$ as an absolute value. Amplitudes of voltages of the first voltage domain may vary in a range between zero and the second supply voltage $V_2$, with $V_2 = V2_2 - V1_2$.

The first signal processing unit $10_1$ includes at least one signal output $12_1$ for providing an information signal. The second signal processing unit $10_2$ includes at least one information signal input $11_2$ for receiving an information signal. Signal transmission from the first signal processing unit $10_1$ to the second signal processing unit $10_2$ is performed using a further signal processing unit $10_{12}$ that receives a further supply voltage $V_{12}$ defining a further voltage domain. The further supply voltage $V_{12}$ is a voltage between a further upper supply potential $V2_{12}$ and a further lower supply potential $V1_{12}$, i.e. $V_{12} = V2_{12} - V1_{12}$. The further supply voltage $V_{12}$ and the first supply voltage $V_1$ overlap, which means that one of the further lower supply potential $V1_{12}$ and the further upper supply potential $V2_{12}$ lies within a voltage range defined by the first supply potential $V_1$, i.e., between the first lower supply potential $V1_1$ and the first upper supply potential $V2_1$. Additionally, the further voltage $V_{12}$ and the second supply voltage $V_2$ overlap, which means that the other one of the further lower supply potential $V1_{12}$ and the further upper supply potential $V2_{12}$ lies within a voltage range defined by the second supply voltage $V_2$, i.e., between the second lower supply potential $V1_2$ and the second upper supply potential $V2_2$.

The first and second supply voltages $V_1$, $V_2$ or the first and second voltage domains do not overlap, or do at most adjoin each other, i.e. have one common supply potential.

The further voltage domain that is, for example, defined by the further supply voltage $V_{12}$ has two voltage sub-domains: a first voltage sub-domain that is defined by the first overlap range, in which the first voltage domain and the further voltage domain overlap; and a second voltage sub-domain that is defined by the second overlap range, in which the second voltage domain and the further voltage domain overlap.

For signal transmission from the first signal processing unit $10_1$ to the second signal processing unit $10_2$, first signal processing unit $10_1$ is configured to provide a first information signal $S_1$ at its signal output $12_1$. First signal processing unit $10_1$ is configured to produce first information signal $S_1$ to be a signal of the first voltage sub-domain. Further signal processing unit $10_{12}$ has at least one signal input $11_{12}$ that receives the first information signal $S_1$. Further signal processing unit $10_{12}$ is configured to provide a second information signal $S_2$ that is dependent on the first information signal $S_1$ and that is a signal of the second voltage sub-domain. This second information signal $S_2$ can be processed by the second signal processing unit $10_2$, because the second voltage sub-domain of the second information signal $S_2$ is also a voltage sub-domain of the second voltage domain, that is defined by the second supply voltage $V_2$. Thus, for processing the second information signal $S_2$ in the second signal processing unit $10_2$ level-shifting in the second signal processing unit $10_2$ is not required.

As will be explained in more detail below, further signal processing unit $10_{12}$ includes a level-shifter (not illustrated in FIG. 1) that is configured to shift first information signal $S_1$ or a signal that is dependent on the first information signal $S_1$ from the first voltage sub-domain to the second voltage sub-domain. However, since these sub-domains adjoin each other and since the supply voltages may be voltages between about 2V and 10V no high-voltage components need to be employed in this level-shifter. Second supply voltage $V_2$ may, in one embodiment, be selected such that it is high enough to allow proper signalling for signals $S_1$, $S_2$, but is low enough to allow use of inexpensive low voltage components in the signal processing units. Thus, use of expensive high voltage components can be avoided.

The first, second and further signal processing units $10_1$, $10_2$, $10_{12}$ may be identical processing units and may be cascaded with additional such signal processing units that each receive a supply voltage, with the supply voltages of two neighbouring processing units in such cascade overlap each other like the first supply voltage $V1_1$ and the further supply voltage $V_{12}$ or the second supply voltage $V_2$ and the further supply voltage $V_{12}$ overlap. In such a cascade arrangement first signal processing unit $10_1$ may receive an information signal $S_0$ at a signal input $11_1$, and shifts this signal $S_0$ to the first voltage sub-domain for producing first transmission signal $S_1$. Equivalently second signal processing unit $10_2$ may be configured to shift second information signal $S_2$ to a third information signal $S_3$ provided at an output $12_2$ in the same manner as further processing unit $10_{12}$ shifts first information signal S1 to second information signal S2.

Figure 2:
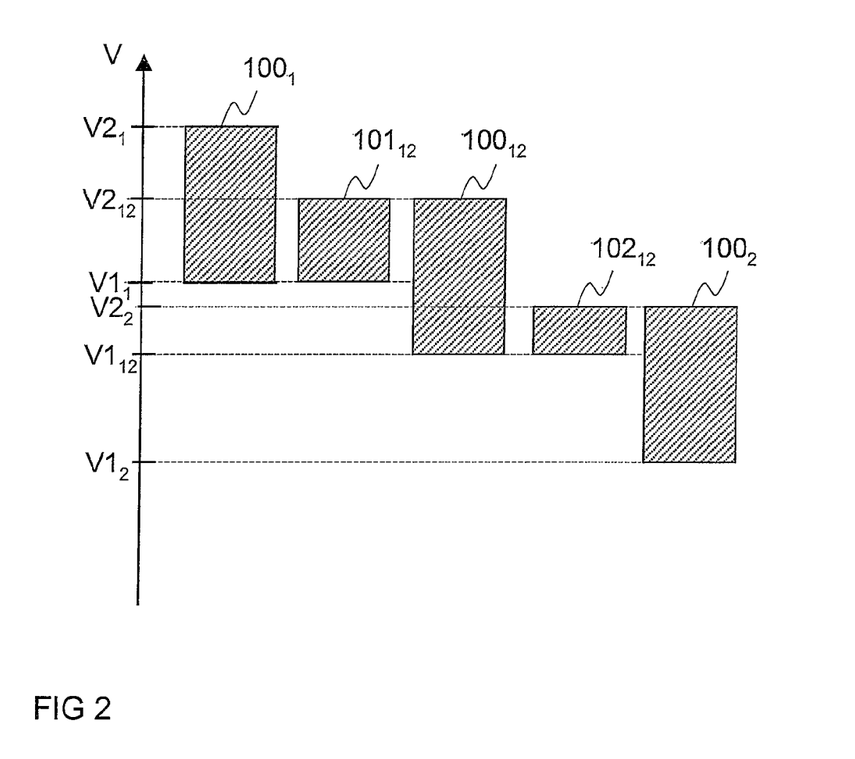
FIG. 2 illustrates one embodiment voltage domains associated with different signal processing units that receive supply voltages of different voltage domains.

For a better understanding, FIG. 2 illustrates the voltage domains associated with the different signal processing units $10_1$, $10_2$, $10_{12}$ and the sub-domains. In FIG. 2 $100_1$, $100_2$, $100_{12}$ denote the first, the second and the further voltage domains that are defined by the first, second and further lower supply voltages $V1_1$, $V1_2$, $V1_{12}$ and the first, second and further upper supply voltages $V2_1$, $V2_2$, $V2_{12}$, respectively. In the example of FIG. 2, the first lower supply voltage $V1_{12}$ is higher than the second lower supply voltage $V1_2$, with the further voltage domain $100_{12}$ overlapping both, the first and the second voltage domains $100_1$, $100_2$. The first sub-domain $101_{12}$ is in this case defined by the first lower supply voltage $V1_1$ and the further upper supply voltage $V2_{12}$. The second sub-domain $102_{12}$ is in this case defined by the further lower supply voltage $V1_{12}$ and the second upper supply voltage $V2_2$. In the example of FIG. 2, the first and second voltage domains $100_1$, $100_2$ do not overlap, i.e. the first lower supply voltage $V1_1$ is higher than the second upper supply voltage $V2_2$. In one example first and second voltage domains may adjoin each other. In this case first lower supply voltage $V1_1$ equals second upper supply voltage $V2_2$, i.e. $V1_1 = V2_2$.

In one embodiment a given voltage domain is higher than an other voltage domain, if the lower supply potential of the given voltage domain is higher than the lower supply voltage of the other voltage domain.

Figure 3:
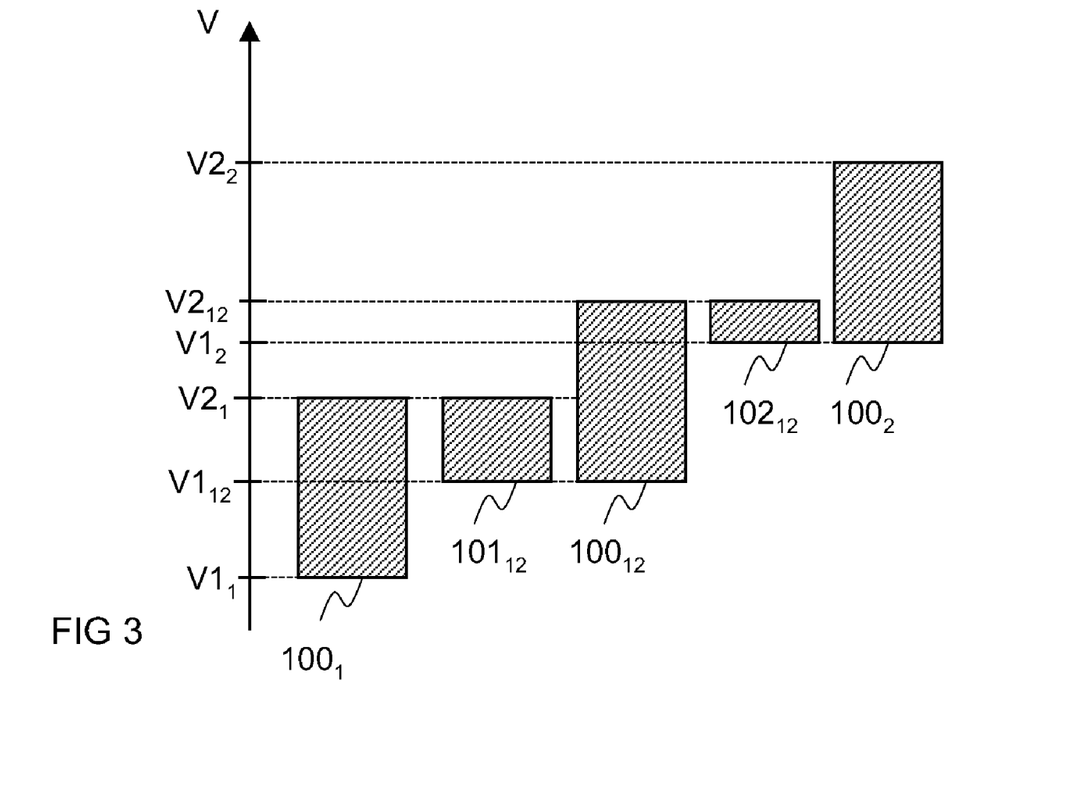
FIG. 3 illustrates one embodiment of voltage domains associated with different signal processing units.

Referring to FIG. 3, in another example, second voltage domain $100_2$ is higher than first voltage domain $100_1$. In this case second lower supply voltage $V1_2$ is higher than first lower supply voltage $V1_1$. The first sub-domain $100_{12}$ that is defined by the overlap range of first voltage domain $100_1$ and further voltage domain $100_{12}$ is in this case defined by further lower supply voltage $V1_{12}$ and upper first supply voltage $V2_1$. The second sub-domain $102_{12}$ that is defined by the overlap range of second and further voltage domain $100_2$, $100_{12}$ is in this case defined by the second lower supply voltage $V1_2$ and the further upper supply voltage $V2_{12}$. First and second voltage domains $100_1$, $100_2$ may be non-overlapping voltage domains (as illustrated), or may adjoin each other (not illustrated). In the latter case the first upper supply voltage $V2_1$ equals the second lower supply voltage $V1_2$, i.e. $V2_1$=$V1_2$.

The information contained in first information signal $S_1$ that—via further signal processing units $10_{12}$—is transmitted from the first to the second signal processing unit $10_1$, $10_2$ may be any information, including, for example, an information representing a temperature in the area of the second signal processing unit $10_{12}$, or an information representing the first supply voltage $V_1$.

Figure 4:
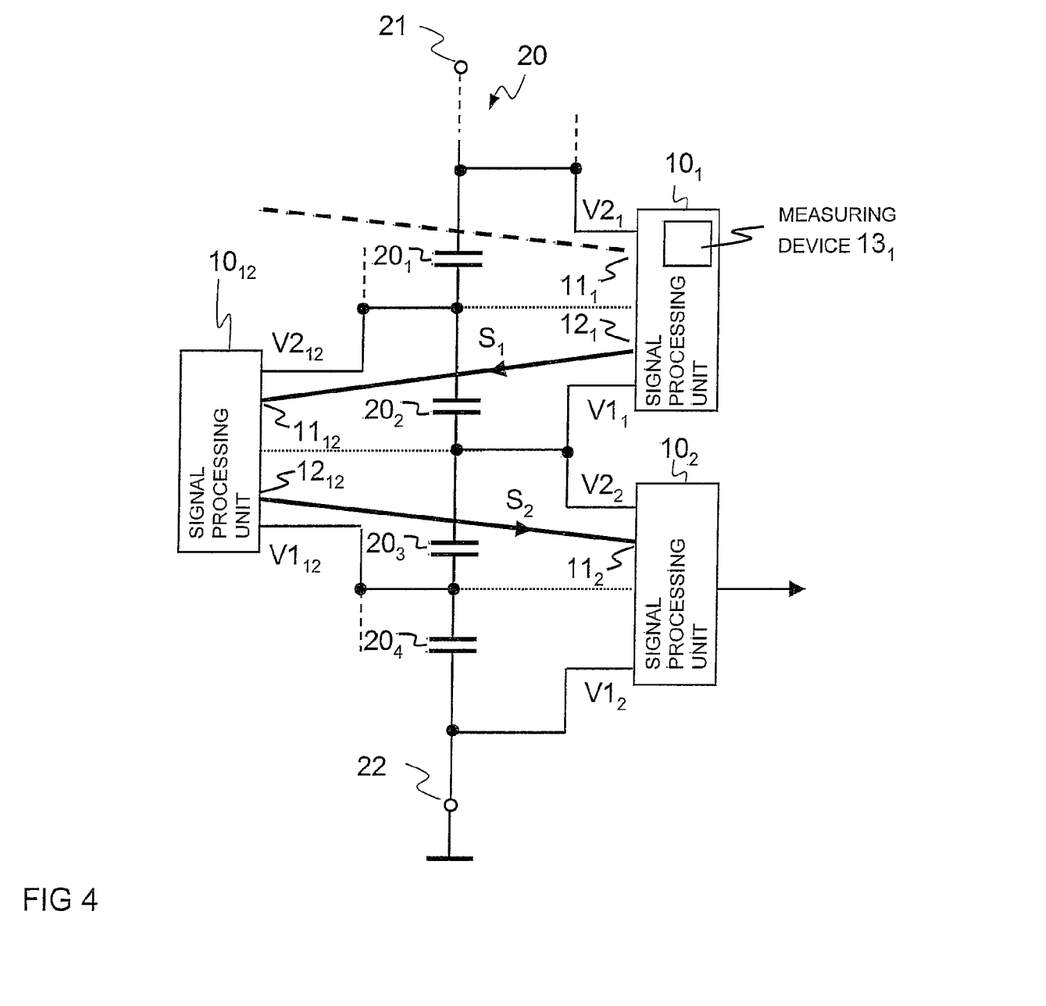
FIG. 4 illustrates one embodiment of a circuit arrangement that includes a number of capacitive storage elements connected in series for providing supply voltages of different voltage domains.

Referring to FIG. 4 the supply voltages $V_1$, $V_{12}$, $V_2$ that define different voltage domains may be provided by a number of capacitive storage elements $20_1$, $20_2$, $20_3$, $20_4$ that are connected in series. Only four of these storage cells connected in series are illustrated in FIG. 4. In one or more embodiments, the battery or storage arrangement 20 can have more than four storage cells connected in series. The storage cells are connected between connecting terminals 21, 22 of the storage arrangement. These connecting terminals 21, 22 serve for connecting the storage arrangement 20 to a load (not illustrated) or for connecting the storage arrangement 20 to a charging circuit (not illustrated).

Each of the individual storage cells $20_1$-$20_4$ has (at least) two terminals. If the storage arrangement 20 is (at least partly) charged a voltage is available between these two terminals of each storage cell $20_1$-$20_4$. In each case, at least two storage cells that are directly connected to each other provide the supply voltage for one of the signal processing units, i.e. one voltage domain is defined by the voltage across two storage elements that are directly connected in series. In FIG. 4 only the terminals of the storage cells necessary for providing the supply voltages to the individual signal processing units $10_1$, $10_{12}$, $10_2$ are illustrated. However, the storage cells $20_1$, $20_2$, $20_3$, $20_4$ may additionally have intermediate terminals for providing voltages that are within the voltage domain defined by the two neighbouring cells. Each of the storage cells $20_1$, . . . $20_4$ may include a number of sub-storage-cells (not illustrated) that are connected in parallel or in series. Intermediate terminals of the storage cells are, for example, terminals of sub-cells that are connected in series thereby forming one of the storage cells $20_1$, . . . $20_4$. The capacitive storage elements $20_1$-$20_4$ or sub-cells forming one storage element may be storage cells of a rechargeable battery 20, like a lithium-ion rechargeable battery.

Two signal processing units that have overlapping supply voltages or voltage domains have at least one storage cell in common. In the embodiment illustrated in FIG. 4, first supply voltage $V_1$ of first signal processing unit $10_1$ is provided by first and second storage cells $20_1$, $20_2$, and further supply voltage $V_{12}$ that overlaps first supply voltage $V_1$ is provided by second and third storage cells $20_2$, $20_3$, with second storage cell $20_2$ being common to first and further signal processing unit $10_1$, $10_{12}$. Second supply voltage $V_2$ that overlaps further supply voltage $V_{12}$ is provided by third and fourth storage cells $20_3$, $20_4$, with third storage cell $20_3$ being common to second and further signal processing units $10_2$, $10_{12}$.

Though in the embodiment illustrated in FIG. 4 two storage cells serve to provide the supply voltage to one signal processing unit, any number of storage cells connected in series may be used for providing the supply voltage to one signal processing unit. However, signal processing units that have overlapping supply voltages or overlapping voltage domains have at least one of these storage cells in common.

According to one embodiment, first signal processing unit $10_1$ includes a measuring device $13_1$ (schematically illustrated) that, for example, is configured to measure one of: the supply voltage $V_1$ provided to the signal processing unit $10_1$; the individual voltage across at least one of the storage cells that together provide first supply voltage $V_1$; or the temperature in the vicinity of the storage cells that provide first supply voltage $V_1$. According to one embodiment, first signal processing unit $10_1$ is arranged in the vicinity of these storage cells $20_1$, $20_2$. In this case, measuring device $13_1$ may be a measuring device that measures the temperature inside signal processing unit $10_1$, this temperature being representative of the temperature in the storage cells.

First signal processing unit $10_1$ is configured to generate first information signal $S_1$ dependent on the at least one measurement result obtained by measuring device $13_1$. Second signal processing unit $10_2$ receives this measurement information via further signal processing unit $10_{12}$ by first signal processing unit $10_1$. Second signal processing unit $10_2$ may be a central processing unit that uses the temperature or voltage information provided by first signal processing unit $10_1$ to control a charging or discharging process of the storage arrangement 20. Storage cells of lithium-ion rechargeable batteries should not be discharged below a given lower voltage and should not be charged above a given upper voltage in order to avoid damage or degradation of the storage cell. Information on voltages of one or both of storage cells $20_1$, $20_2$ provided by first signal processing unit $10_1$ may therefore be used by second signal processing unit $10_2$ to control a charging or discharging process. Further, during operation a temperature of the individual storage cells should not exceed a given temperature value in order to avoid damage or degradation of the storage cells. A temperature information provided by first signal processing unit $10_1$ that is representative of a temperature of one or both of first and second storage cells $20_1$, $20_2$ may, for example, be used in second signal processing unit $10_2$ to disconnect storage arrangement 20 from a load (not illustrated) in case the temperature exceeds a given temperature value, or to take other appropriate protection measures. These measures may include, but are not restricted to: reducing the current provided by the storage cell arrangement to a load; cooling the storage cell arrangement. Cooling the storage cell arrangement may be performed using any cooling devices, like fans or liquid cooling devices. Second signal processing unit $10_2$ has a control output (schematically illustrated) for providing a control signal that is suitable to control a charging or discharging process or connection of the storage arrangement 20 to a load.

The supply voltages $V_1$, $V_2$ provided to first and second signal processing units $10_1$, $10_2$ or the voltage domains associated with these supply voltages do not overlap. It should be noted that the information provided by first signal processing unit $10_1$, for example, on temperature or on voltage of the storage cells $20_1$, $20_2$, is provided to second signal processing unit $10_2$ via further signal processing unit $10_{12}$ that has a supply voltage $V_{12}$ that overlaps both, the supply voltages $V_1$, $V_2$ of the first and second signal processing unit $10_1$, $10_2$.

Figure 5:
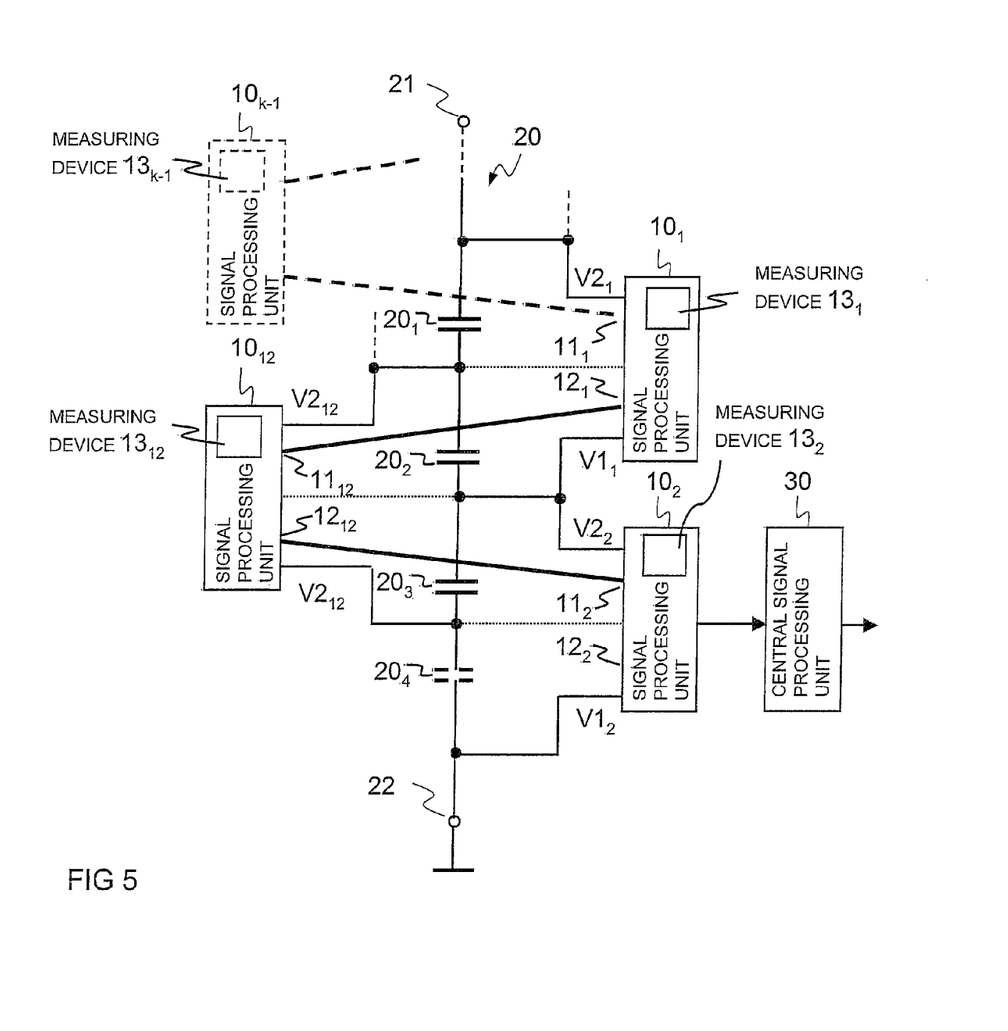
FIG. 5 illustrates one embodiment of a signal processing unit that receives a first information signal of a first voltage domain and that provides a second information signal of a second voltage domain.

Referring to FIG. 5 first, second and further signal processing units $10_1$, $10_2$, $10_{12}$ may have identical functionalities, i.e. each have a measuring device $13_1$, $13_2$, $13_{12}$ for measuring at least one of a voltage or a temperature of at least one of the associated storage cells. In this connection an "associated storage cell" is a storage cell that (together with at least one further storage cell) provides the supply voltage to one of the signal processing units. In an arrangement in which two storage cells provide the supply voltage to one signal processing unit and in which one storage cell is common to two signal processing units, one signal processing unit may be associated to one storage cell for monitoring a voltage and/or temperature of the storage cell. In the example of FIG. 5 first signal processing unit $10_1$ may monitor voltage and/or temperature of the second storage cell $20_2$, further signal processing unit $10_{12}$ may monitor temperature and or voltage of the third storage cell $20_3$, and second signal processing unit $10_2$ may monitor temperature or voltage of four storage cells $20_4$. In this arrangement a central processing unit 30 is connected to output terminal $12_2$ of second signal processing unit $10_2$. Via this signal output $12_2$ second signal processing unit $10_2$ outputs information provided by its own measuring device $13_2$, information received by further signal processing unit $10_{12}$ and provided by the measuring device $13_{12}$ of this further signal processing unit $10_{12}$, or information provided by the first signal processing unit $10_1$. Examples on how to avoid conflicts in information transmission by the individual signal processing units $10_1$, $10_2$, $10_{12}$ and on how to allow central signal processing unit 30 to differentiate between the received information will be given further below.

Central processing unit 30 evaluates the information as received from the individual processing units $10_1$, $10_{12}$, $10_2$ and uses this information to control a charging or discharging process of the storage arrangement 20, or a connection of a storage arrangement 20 to a load (not illustrated). S30 in FIG. 5 denotes a control signal provided by central processing unit for this purpose.

The signal processing units $10_1$, $10_2$, $10_{12}$ illustrated in FIG. 5 form a cascade of three neighbouring signal processing units, in which two signal processing units that are in direct signal communication with each other have overlapping supply voltages or overlapping voltage domains. In this connection "signal processing units that are in direct signal communication" are signal processing units that are connected to each other via a communication line. "Directly connected" means that there is no additional signal processing unit connected between these two signal processing units.

FIG. 5 illustrates three of such cascaded signal processing units in order to explain the basic principle of signal communication between the individual signal processing units. Generally any number of such signal processing units may be cascaded, with two neighbouring signal processing units having overlapping supply voltages. In such an arrangement communication between signal processing units that have non-overlapping supply voltages is possible without requiring high voltage level shifters in that communication is performed via intermediate signal processing units, like further signal processing unit $10_{12}$ that is an intermediate processing unit to first and second signal processing units $10_1$, $10_2$. Reference signs $10_{k-1}$, $10_k$ denote two additional signal processing units (illustrated in dashed lines) of such a cascade.

Figure 6:
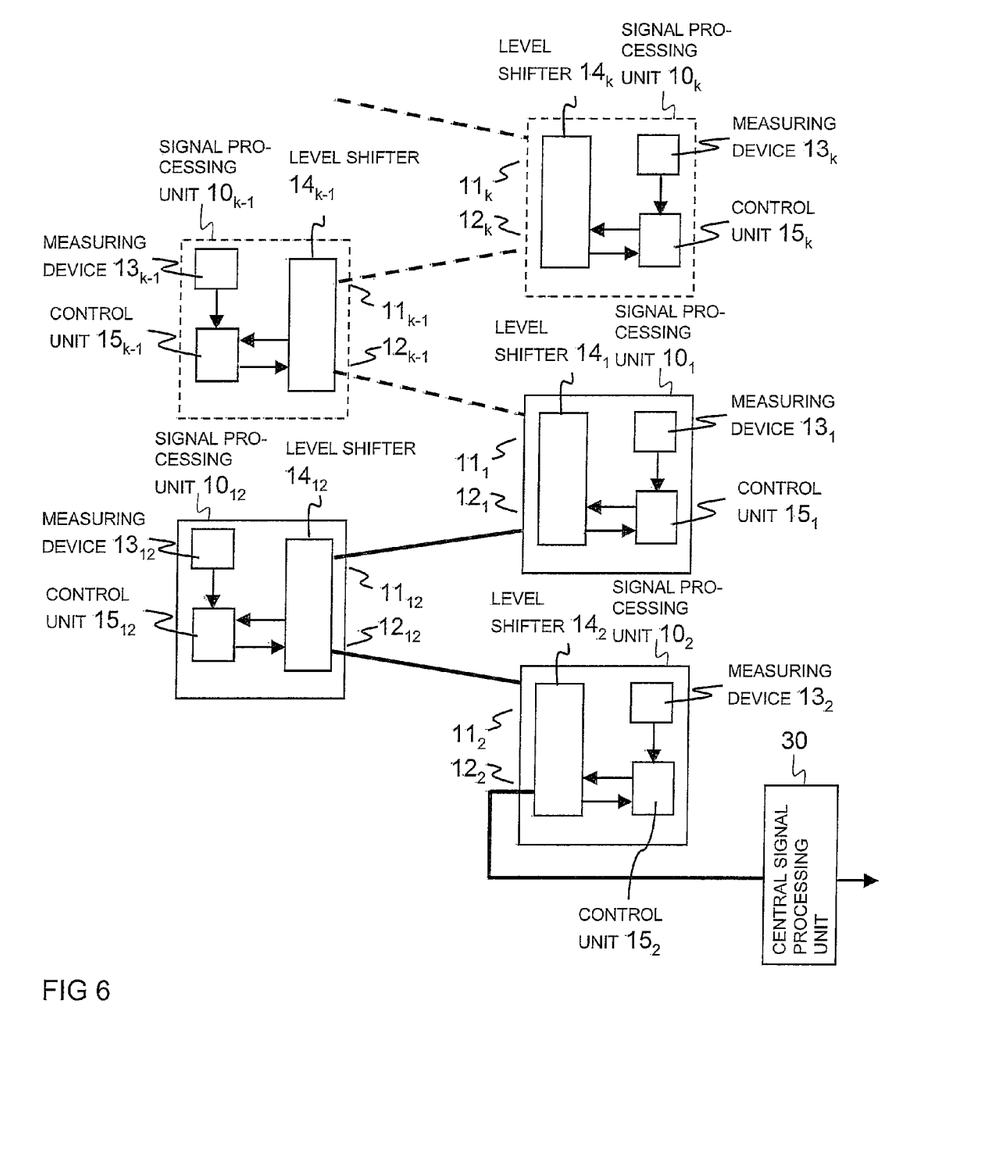
FIG. 6 illustrates one embodiment of a level-shifter of the signal processing unit of FIG. 5.

FIG. 6 illustrates a more detailed embodiment of the signal processing units of the arrangement according to FIG. 5. For clarity reasons the storage cells providing the supply voltages to the individual signal processing units are not illustrated in FIG. 6. Further, three signal processing units are illustrated in FIG. 6. However, referring to the discussion above any number of signal processing units may be cascaded in the arrangement. In the following description reference number 10 designates any of the signal processing units $10_1$, $10_2$, $10_{12}$.

Each of the signal processing units 10 comprises a level shifter $14_1$, $14_{12}$, $14_2$ (that in the following will be designated as 14 in cases where a differentiation between the individual processing units 10 is not required) that is connected between the input $11_1$, $11_{12}$, $11_2$ and the output $12_1$, $12_{12}$, $12_2$ (which in the following will be designated as 11 and 12 in cases where a differentiation between the individual processing units 10 is not required) of the individual signal processing units 10. These level shifters 14 serve to shift signals between the two voltage sub-domains that are associated with each signal processing units 10. Referring to the previous discussion the two voltage sub-domains of one signal processing 10 unit is defined by the ranges in which the voltage domain of one signal processing unit 10 overlaps with the voltage domains of the two neighbouring signal processing units 10. These level shifters 14 together with the signal lines between the output of one signal processing unit 10 and the input of the neighbouring signal processing unit 10 form a signal bus that allows signal communication between the central signal processing unit 30 and the individual signal processing units 10 that are connected to the storage cells.

Connected to this bus are control units $15_1$, $15_{12}$, $15_2$ (which in the following will be designated as 15 in cases where a differentiation between the individual processing units 10 is not required). In one embodiment illustrated in FIG. 6 these control units are connected to the level shifter 14 within the processing units 10. The control units 15 are configured to at least one of: receiving information via the bus and sending information via the bus. Measuring units 13 are connected to the control units 15, the control units 15 in this case acting as an interface between the measuring units 13 and the signal bus. The signal bus may be a unidirectional or a bidirectional bus. A unidirectional bus allows signal communication only in one direction, which is either from the signal processing units 10 to the central processing unit 30, or from the central processing unit 30 to the signal processing units 10.

A bidirectional bus allows signal communication in both directions. In the following signal communication from the signal processing units 10 to central processing unit 30 will be referred to as uplink-communication, and signal communication from central processing unit 30 to signal processing units 10 will be referred to as downlink-communication. In this connection it should be mentioned that the terms "uplink" and "downlink" are not indicative of the relationship between a supply voltage (not illustrated) of central signal processing unit 30 and supply voltages of the signal processing units 10. The principle that has been explained before and that will be explained in the following applies to systems in which in the arrangement the lower supply voltages decrease in the direction of the second signal processing unit $10_2$ and the central processing unit 30 (like in the embodiment illustrated in FIG. 2), or in which the lower supply voltages increase in the direction of the second signal processing unit $10_2$ and the central processing unit 30 (like in the embodiment illustrated in FIG. 3).

A bidirectional bus may comprise a single communication line that allows signal transmission in two directions, or may comprise two separate transmission lines: a first line for uplink-transmission and a second line for downlink-transmission. Central processing unit 30 is configured to request the individual signal processing units 10 to transmit their information. For this purpose unique identifiers are assigned to the individual signal processing units 10. Central processing unit 30 requests information from one individual processing unit by transmitting the unique identifier on this signal processing unit via the bus. The control unit, that listens to the bus receives this identifier and transmits the information provided by the measuring unit via the bus uplink to the central processing units 30. The measuring units 30 may be configured to provide more than one information. These measuring units, for example, may be configured to provide a voltage information and a temperature information. If central processing unit 30 requests one processing unit 10 to transmit its information all this information may be transmitted via a bus. In another example central processing unit 30 additionally to the unique identifier transmits a command that specifies the information that is to be transmitted from the processing unit 10 to the central processing units 30.

Instead of using a bidirectional signal, bidirectional communication may also be performed by providing two unidirectional busses that are parallel to each other. One of these busses is for signal communication in one direction, i.e. uplink or downlink, while the other one of these busses is for signal communication in the other, opposite direction.

Generally, any known bus structure and bus protocol may be used for communication between central processing unit 30 and the individual signal processing units 10. Examples of these bus structures and protocols are LIN, SPI/SSC or IIC.

Figure 7:
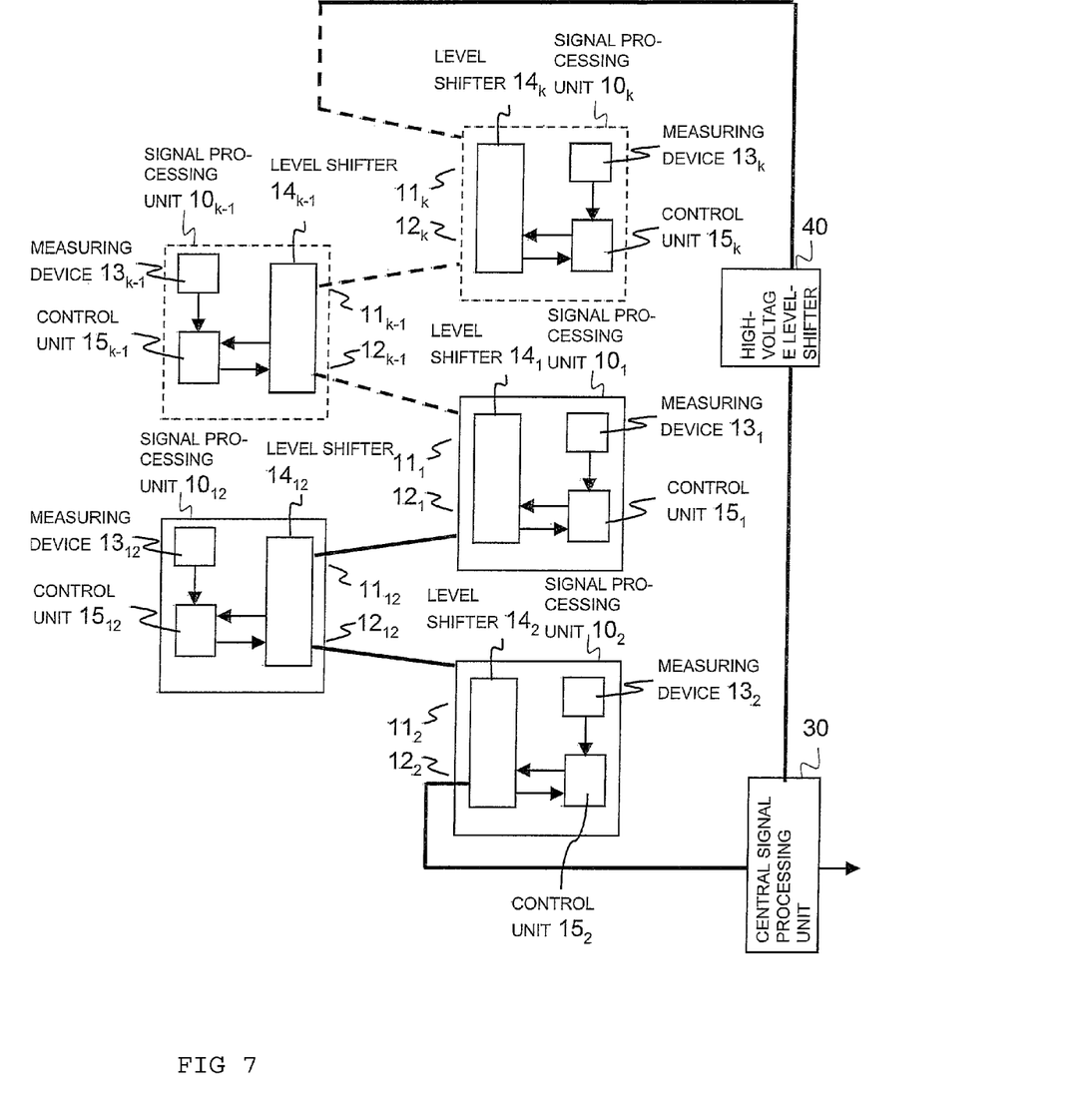
FIG. 7 illustrates one embodiment of a signal processing unit that receives an information signal of a first voltage domain and provides a second information signal of a second voltage domain.

In one embodiment illustrated in FIG. 7 the bus has a ring structure. In this case a high-voltage level shifter 40 is provided between central processing unit 30 and the signal processing unit that is most distant away to central processing unit 30. In the arrangement with a ring bus a single line bus may be used. Central processing unit 30 transmits the unique identifier in one direction, for example, via signal processing unit $10_2$, and a signal processing unit that is identified by this identifier forward its information in the same direction via the bus, with this information will finally be forwarded to the central processing unit 30 via high voltage level-shifter 40. In FIG. 7 signal processing unit $10_k$ is the "last" processing unit in the queue of signal processing unit. The output of this signal processing unit $10_k$ is connected to the high-voltage level-shifter 40. High-voltage level shifter 40 is configured to shift signals of the voltage domain associated with the last signal processing unit $10_k$ to the voltage domain of the central processing unit 30. These voltage domains do not overlap and may have a voltage difference of several 10V to up to several 100V between their lower supply potentials.

Figure 8:
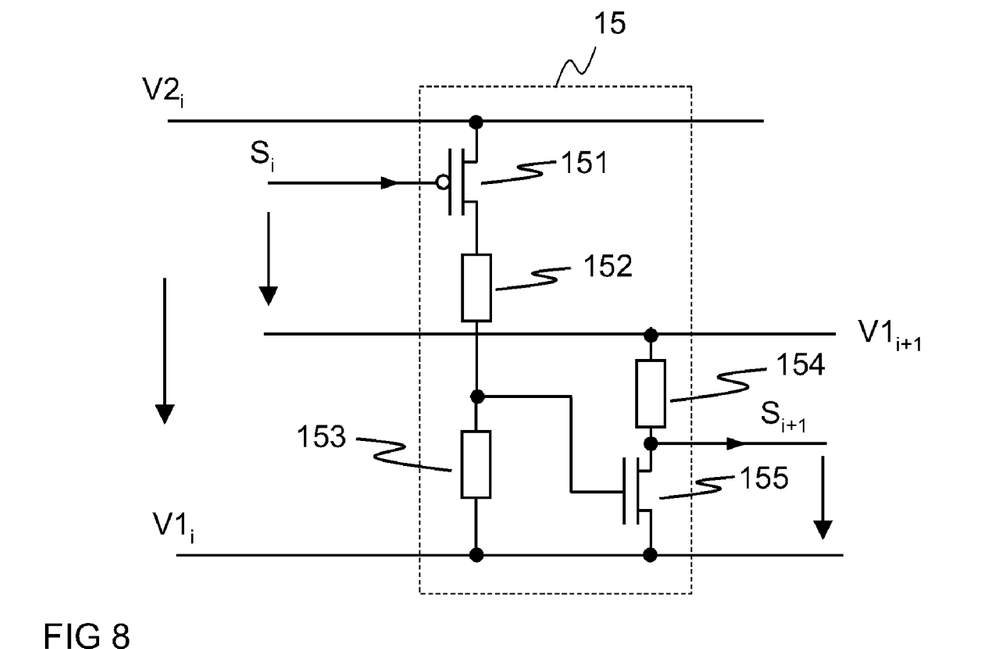
FIG. 8 illustrates one embodiment of a level-shifter of the signal processing unit according to FIG. 7.

For internally shifting an input signal of a signal processing unit 10 from one voltage sub-domain of the signal processing unit 10 to the other voltage sub-domain of the signal processing unit any kind of level-shifter may be used. A first example of such level-shifter is illustrated in FIG. 8. The level-shifter of FIG. 8 is configured to shift a signal from a higher sub-domain to a lower sub-domain. In FIG. 8, $V1_i$ and $V2_i$ denote lower and upper supply potentials that are provided to the signal processing unit the level-shifter 15 is integrated in. $V1_{i+1}$ denotes a supply potential that divides the voltage domain defined by lower and upper supply potentials $V1_i, V2_i$ into the two sub-domains. $S_i$ is an input signal of level-shifter 15. This input signal may be a signal that is provided by a neighbouring signal process unit (not illustrated) or that is generated by the control circuit dependent on a measurement result provided by the measuring circuit (not illustrated) of the signal processing unit. $S_{i+1}$ is an output signal of level-shifter 15. This output signal may be a signal that is directly output by signal processing unit. In one embodiment, the output signal of level-shifter 15 is modified by the control circuit of this signal processing unit before outputting the signal.

The level-shifter 15 comprises an input transistor 151 that has a control terminal and a load path. The load path is connected in series to a voltage divider 152, 153 between the supply terminals for the lower and the upper supply potentials $V1_i, V2_i$. First transistor 151 receives input signal $S_i$ as a control signal. The level-shifter 15 has a second transistor 155, that has a control terminal and a load path. The control terminal of the second transistor 155 is connected to an output terminal of voltage divider 152, 153, and the load path of the second transistor 155 is connected in series to a load resistance 154 between terminals for the lower supply potential $V1_i$ and the intermediate potential $V1_{i+1}$, which is the potential that separates the voltage domain into the two sub-domains. The output signal $S_{i+1}$ can be tapped off at a terminal between the load path of second transistor 155 and load resistance 154.

The functionality of the level-shifter according to FIG. 8 will shortly be explained: Assuming that input signal $S_i$ has a low signal level related to intermediate potential $V1_{i+1}$, i.e. a signal level that turns on first transistor 151. The voltage drop across voltage divider resistor 153 in this case switches on second transistor 155 which results in a low signal level of output $S_{i+1}$. If, on the other hand side, input signal $S_i$ has a high signal level, then first transistor 151 blocks. A voltage drop across resistor 153 is not sufficient to switch second transistor 155 on, which results in a high signal level of output signal $S_{i+1}$. The level-shifter of FIG. 8 is not inverting, i.e. low signals at the input result in low signals at the output, and vice versa.

Besides the at least one bus that is used for signal communication an additional bus (not illustrated) the system may include an additional clock bus that transmits a clock signal from the central unit 30 to the individual signal processing units $10_1, \ldots$.

Figure 9:
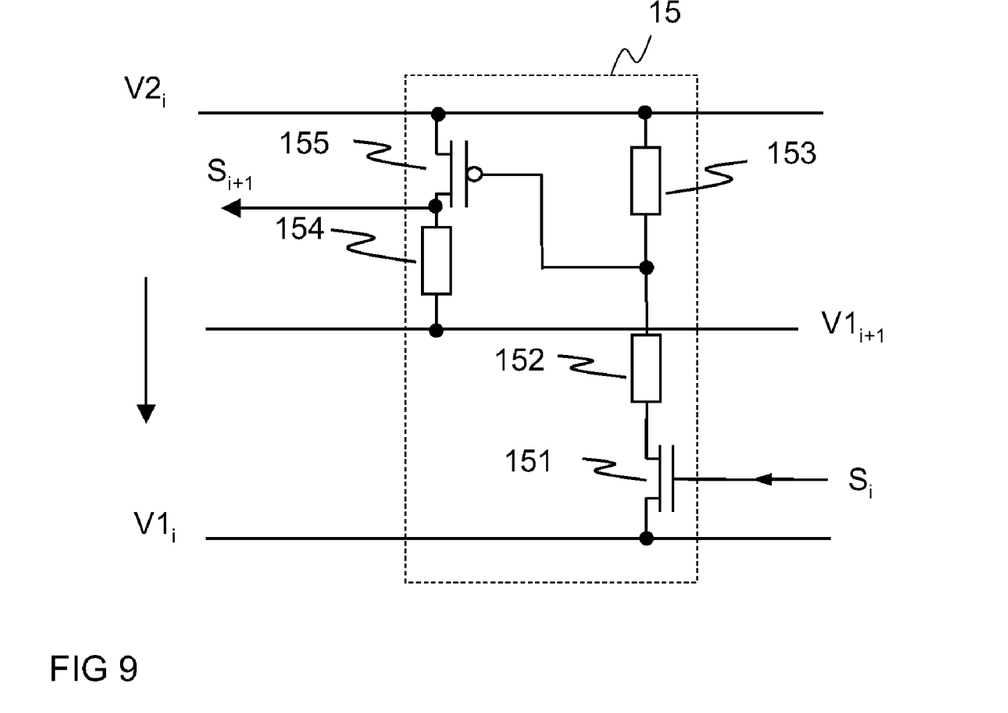
FIG. 9 illustrates one embodiment of a charge balancing circuit for balancing electrical charge between two capacitive storage elements connected in series.

FIG. 9 illustrates one embodiment of a level-shifter that is suitable for shifting an input signal $S_i$ from a lower sub-domain to an upper sub-domain. In FIG. 9 same reference signs designate same components as in FIG. 8. The level-shifter of FIG. 9 is different from the level-shifter in FIG. 8 in that first transistor 151 of the level-shifter in FIG. 9 is an n-type transistor, while the input transistor 152 of the level-shifter in FIG. 8 is a p-type transistor. Further, the output transistor of the level-shifter in FIG. 9 is a p-type transistor, while the output transistor 155 of the level-shifter in FIG. 8 is an n-type transistor.

A communication system as disclosed before is, in one embodiment, suitable in arrangements in which the supply voltages to the different signal processing units 10 are used in battery stacks with a multitude of storage elements that are connected in series in order to achieve a higher total voltage between terminals for connecting a load thereto. Typical applications in such systems include, but are not restricted to, monitoring a cell status of charge storage cells used in the system, or charge balancing between individual charge storage cells.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A signal transmission method, comprising:
   providing a first signal processing unit receiving a first supply voltage;
   providing a second signal processing unit receiving a second supply voltage, the first supply voltage and the second supply voltage overlapping each other in a first overlap range;
   providing a third signal processing unit receiving a third supply voltage, the second supply voltage and the third supply voltage overlapping each other in a second voltage overlap range;

transmitting a first information signal from the first signal processing unit to the second signal processing unit;
transmitting a second information signal dependent on the first information signal from the second signal processing to the third signal processing unit;
providing the first, second and third supply voltages by at least three capacitive storage elements connected in series to each other, the first supply voltage being a voltage across a series circuit of the first and second capacitive storage elements, the second supply voltage being a voltage across a series circuit of the second and third capacitive storage elements, and the third supply voltage being dependent on a voltage across the third capacitive storage element; and configuring the first signal processing unit configured to measure a temperature of at least one of the first and second capacitive storage elements and configured to generate the first information signal such that it represents the temperature.

2. The method of claim 1, comprising wherein in which the first information signal has a signal range that lies within the first overlap range, and the second information signal has a signal range that lies within the second overlap range.

3. The method of claim 2, wherein the second signal processing unit comprises a level-shifter configured to shift an input signal that has a signal range lying within the first overlap range to an output signal that has a signal range lying within the second overlap range.

4. The method of claim 3, comprising wherein the level-shifter receives the first information signal as an input signal and provides the second information signal as an output signal.

5. The method of claim 3, wherein the second signal processing unit comprises a processing unit configured to receive the first information signal, to process the first information signal, and to provide a processed first information signal to the level shifter, and wherein the level-shifter receives the processed first information signal as an input signal and provides the second information signal as an output signal.

6. The method of claim 1, in which a fourth capacitive storage element is connected in series to the third capacitive storage element and in which the third supply voltage is a voltage across a series circuit of the third and fourth capacitive storage element.

7. The method of claim 1, comprising wherein the capacitive storage elements are accumulator cells.

8. The method of claim 1, comprising wherein the first supply voltage is present between a first lower supply potential and a first upper supply potential;
the second supply voltage is present between a second lower supply potential and a second upper supply potential;
the third supply voltage is present between a third lower supply potential and a third upper supply potential; and
wherein the first upper supply potential is higher than the third upper supply potential.

9. The method of claim 8, comprising wherein the first lower supply potential equals the third upper supply potential.

10. The method of claim 1, comprising wherein the first supply voltage is present between a first lower supply potential and a first upper supply potential;
the second supply voltage is present between a second lower supply potential and a second upper supply potential;
the third supply voltage is present between a third lower supply potential and a third upper supply potential; and
wherein the first upper supply potential is lower than the third upper supply potential.

11. The method of claim 10, comprising wherein the first upper supply potential equals the third lower supply potential.

12. A signal transmission method, comprising:
providing a first signal processing unit receiving a first supply voltage;
providing a second signal processing unit receiving a second supply voltage, the first supply voltage and the second supply voltage overlapping each other in a first overlap range;
providing a third signal processing unit receiving a third supply voltage, the second supply voltage and the third supply voltage overlapping each other in a second voltage overlap range;
transmitting a first information signal from the first signal processing unit to the second signal processing unit;
transmitting a second information signal dependent on the first information signal from the second signal processing to the third signal processing unit;
providing the first, second and third supply voltages by at least three capacitive storage elements connected in series to each other, the first supply voltage being a voltage across a series circuit of the first and second capacitive storage elements, the second supply voltage being a voltage across a series circuit of the second and third capacitive storage elements, and the third supply voltage being dependent on a voltage across the third capacitive storage element; and
configuring the first signal processing unit configured to measure a voltage across at least one of the first and second capacitive storage elements and configured to generate the first information signal such that it represents the temperature.

13. A signal transmission arrangement, comprising:
a first signal processing unit configured to receive a first supply voltage;
a second signal processing unit configured to receive a second supply voltage, the first supply voltage and the second supply voltage overlapping each other in a first overlap range;
a third signal processing unit configured to receive a third supply voltage, the second supply voltage and the third supply voltage overlapping each other in a second voltage overlap range;
the first signal processing unit configured to transmit a first information signal from the first signal processing unit to the second signal processing unit;
the second signal processing configured to transmit a second information signal that is dependent on the first information signal from the second signal processing to the third signal processing unit;
at least three capacitive storage elements that are connected in series to each other;
the first supply voltage being a voltage across a series circuit of the first and second capacitive storage elements;
the second supply voltage being a voltage across a series circuit of the second and third capacitive storage elements;
the third supply voltage being dependent on a voltage across the third capacitive storage element; and
wherein the first signal processing unit is configured to measure a temperature of at least one of the first and second capacitive storage elements and configured to generate the first information signal such that it represents the temperature.

14. The arrangement of claim 13, wherein the second signal processing unit comprises a level-shifter configured to shift an input signal having a signal range lying within the first overlap range to an output signal having a signal range lying within the second overlap range.

15. The arrangement of claim 14, comprising wherein the level-shifter receives the first information signal as an input signal and provides the second information signal as an output signal.

16. The arrangement of claim 14, wherein the second signal processing unit comprises a processing unit configured to receive the first information signal, to process the first information signal, and to provide a processed first information signal to the level shifter, and wherein the level-shifter receives the processed first information signal as an input signal and provides the second information signal as an output signal.

17. The arrangement of 13, further comprising:

a fourth capacitive storage element connected in series to the third capacitive storage element, the third supply voltage being a voltage across a series circuit of the third and fourth capacitive storage element.

18. The method of claim 13, comprising wherein the capacitive storage elements are accumulator cells.

19. A signal transmission arrangement, comprising:

a first signal processing unit configured to receive a first supply voltage;

a second signal processing unit configured to receive a second supply voltage, the first supply voltage and the second supply voltage overlapping each other in a first overlap range;

a third signal processing unit configured to receive a third supply voltage, the second supply voltage and the third supply voltage overlapping each other in a second voltage overlap range;

the first signal processing unit configured to transmit a first information signal from the first signal processing unit to the second signal processing unit;

the second signal processing configured to transmit a second information signal that is dependent on the first information signal from the second signal processing to the third signal processing unit;

at least three capacitive storage elements that are connected in series to each other;

the first supply voltage being a voltage across a series circuit of the first and second capacitive storage elements;

the second supply voltage being a voltage across a series circuit of the second and third capacitive storage elements;

the third supply voltage being dependent on a voltage across the third capacitive storage element; and wherein the first signal processing unit is configured to measure a voltage across at least one of the first and second capacitive storage elements and configured to generate the first information signal such that it represents the temperature.

\* \* \* \* \*